US006926802B2

(12) United States Patent
Lee

(10) Patent No.: US 6,926,802 B2
(45) Date of Patent: Aug. 9, 2005

(54) EXHAUST RING OF DRY ETCHING DEVICE

(75) Inventor: Jun-Taek Lee, Kimjae (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/102,689

(22) Filed: Mar. 22, 2002

(65) Prior Publication Data

US 2003/0010448 A1 Jan. 16, 2003

(30) Foreign Application Priority Data

Jul. 12, 2001 (KR) ........................................ 2001-41941

(51) Int. Cl.[7] ......................... C23F 1/00; H01L 21/306; C23C 16/00

(52) U.S. Cl. ............... 156/345.51; 118/728; 118/723 R

(58) Field of Search ....................... 118/723 E, 723 ER, 118/722, 728; 156/345.43, 345.44, 345.45, 315.3

(56) References Cited

U.S. PATENT DOCUMENTS 5,389,197 A 2/1995 Ishimaru et al. ............ 156/643
6,170,429 B1 * 1/2001 Schoepp et al. ........ 118/723 R
6,178,919 B1 * 1/2001 Li et al. .................. 118/723 E

* cited by examiner

*Primary Examiner*—Rudy Zervigon
(74) *Attorney, Agent, or Firm*—Lee & Morse, P.C.

(57) ABSTRACT

An exhaust ring made of a material other than quartz, thereby reducing the creation of polymer particles on the exhaust ring is provided in the present invention. The exhaust ring of the present invention is formed of two parts wherein only one part is exposed to and etched by plasma. Accordingly, only the etched and damaged part will require replacement due to plasma damage, thus reducing production costs. More particularly, the exhaust ring comprises an upper ring that is exposed to plasma and a lower ring that is not exposed to plasma.

18 Claims, 3 Drawing Sheets

30
22a
32
34
22b
36

EXHAUST RING OF DRY ETCHING DEVICE

BACKGROUND OF THE INVENTION

1. Field of the Invention

The present invention relates to an etching device for use in semiconductor fabricating equipment. More particularly, the present invention relates to an exhaust ring that prevents a wafer from being damaged while the wafer is etched by plasma.

2. Description of the Related Art

Generally, semiconductor devices are fabricated by repeatedly performing various semiconductor fabricating processes, such as a diffusion process, an etching process, a photolithography process, a thin film forming process, etc.

The etching process may include a wet etching process and/or a dry etching process. The wet etching process has been commonly applied in large scaled integrated circuit (LSI) techniques by which the minimum line width of semiconductor devices may be fabricated in the range of several tens of micrometers to several hundreds of micrometers. However, wet etching is infrequently applied to VLSI and ULSI devices because of the limitation placed on the degree of integration attainable due to isotropy. Accordingly, the dry etching process is conventionally used. The ultra fine processing of wafers is accomplished via plasma etching in a process chamber that is entirely isolated from the outside by an ultra-vacuum state.

Other semiconductor fabrication equipment makes use of high frequency power and gas to perform an etching process. In this type of equipment, the gas is converted into plasma by the high frequency power, and portions of a wafer, which are exposed by pattern masks, are reacted with the plasma. A polymer created as a byproduct of the reaction is deposited in all regions in which the processes are performed. The polymer, operating as particles, accumulates on wafers thereby damaging them.

Referring to FIG. 1, which shows a conventional oxide film dry etching chamber used in semiconductor fabricating equipment, the chamber comprises a housing 10, and the related structure in which the housing 10 is coupled to other elements. A shield (not shown) provided at an upper portion of the inner wall of the housing 10 prevents the polymer from being deposited on the inner wall of the housing 10.

An upper electrode 14 to which a high frequency power is applied is provided at an upper portion of the housing 10. The upper electrode 14 serves to isolate the interior of the housing 10 from the outside. A focus ring 18, which is made of the same or a similar material as a wafer 11, is positioned under the upper electrode 14 in the housing 10 and secures the wafer 11. A chuck and a lower electrode 16, to which a high frequency power is applied, are movably provided in the housing 10, so that the upper electrode 14 faces the lower electrode 16.

The wafer 11 is positioned at the center portion of the high frequency powered region of the lower electrode 16 and is fixed to the lower electrode 16 by electrostatic power or vacuum power. A stepped portion of the lower electrode 16 provides support for the edge portion of the wafer 11.

A cover ring 20 that serves to support the lower portion of the focus ring 18 is provided at the outer wall of the lower electrode 16. An exhaust ring 22 for preventing plasma leakage is provided at a lower portion of the cover ring 20. The exhaust ring 22 is made of a quartz material. A base ring 24 is provided at a lower portion of exhaust ring 22.

FIG. 2 illustrates a perspective view of a conventional exhaust ring 22.

Procedures of processes using the structure as constructed will now be described with reference to FIGS. 1 and 2.

When a wafer 11 is first placed in the housing 10 and loaded on a chuck, i.e., on the lower electrode 16 and the inner portion of the focus ring 18, the chuck moves up so that the wafer 11 approaches the upper electrode 14. Next, a process gas is supplied between the upper and lower electrodes 14, 16 onto the wafer 11 from a predetermined portion of the chamber. A high frequency is then applied to the upper and lower electrodes 14, 16 thereby changing the process gas into a plasma state. The process gas as a plasma reacts with a portion of oxide film on a wafer that is not masked by a photoresist pattern, thereby etching the portion of the oxide film on the wafer.

However, there is a problem because the exhaust ring 22 is made of a quartz material and is also etched by the plasma when polymer particles are deposited on exposed portions of the exhaust ring 22. The polymer particles accumulate on the wafer and damage it. Another problem is that since the exhaust ring 22 is formed as one body, as shown in FIG. 2, the entire exhaust ring 22 must be replaced when the plasma damages it. Frequent replacement of the exhaust ring and damaged wafers result in decreased production yield and increased production costs.

SUMMARY OF THE INVENTION

To solve the problems described above, it is a feature of an embodiment of the present invention to provide an exhaust ring that is made of a material other than quartz, as is used conventionally, thereby reducing the creation of polymer particles on the exhaust ring.

It is another feature of an embodiment of the present invention to provide an exhaust ring that is formed of two parts, in which only one part is exposed to and etched by plasma so that only that part requires replacement, thereby reducing production costs.

In order to achieve the above and other features and advantages, the present invention provides an exhaust ring comprised of an upper ring that is exposed to plasma and a lower ring that is isolated from plasma.

BRIEF DESCRIPTION OF THE DRAWINGS

The foregoing and other features and advantages of the present invention will be better understood from the following detailed description of preferred embodiments of the present invention with reference to the accompanying drawings, in which.

DETAILED DESCRIPTION OF THE INVENTION

Figure 1:
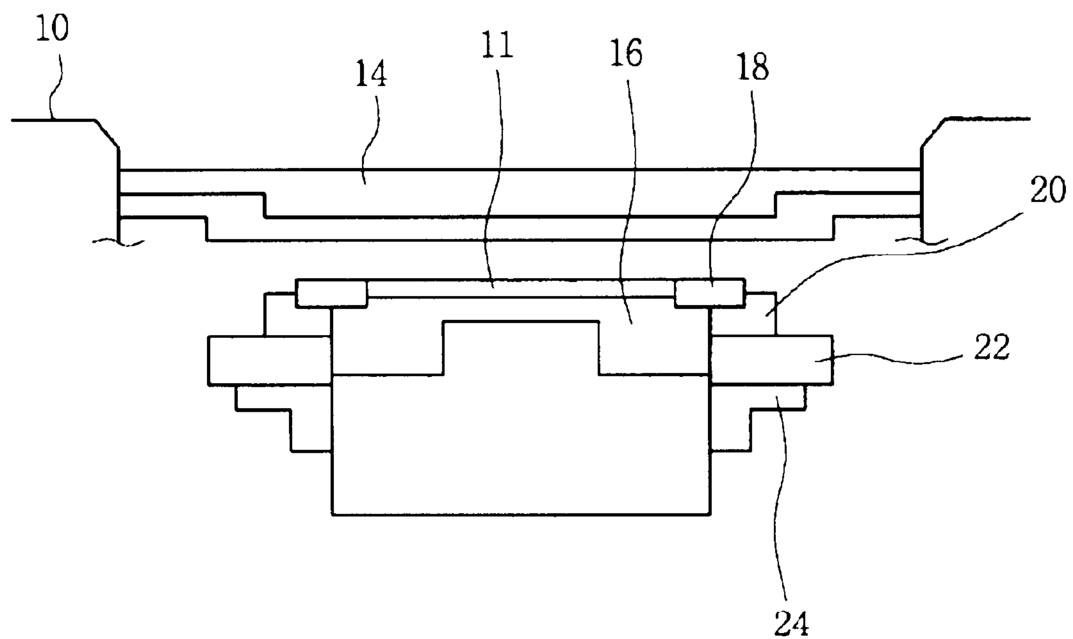
FIG. 1 illustrates a structure diagram showing a conventional oxide film dry etching chamber of semiconductor fabricating equipment.
Figure 2:
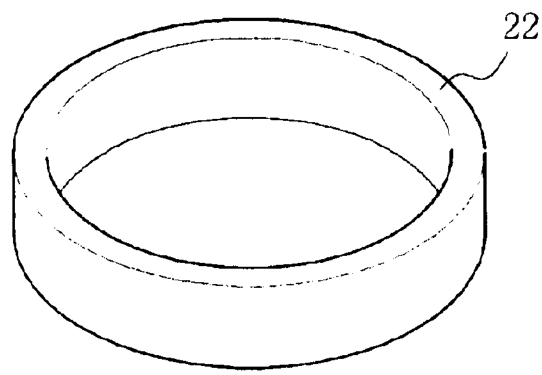
FIG. 2 illustrates a perspective view of a conventional exhaust ring.

Korean Patent Application Number 2001-41941, filed on Jul. 12, 2001, and entitled: “Exhaust Ring of Dry Etching Device,” is incorporated by reference herein in its entirety.

Hereinafter, preferred embodiments of the present invention will be described in detail with reference to the accompanying drawings. In the drawings, like reference numerals refer to like elements throughout.

Figure 3:
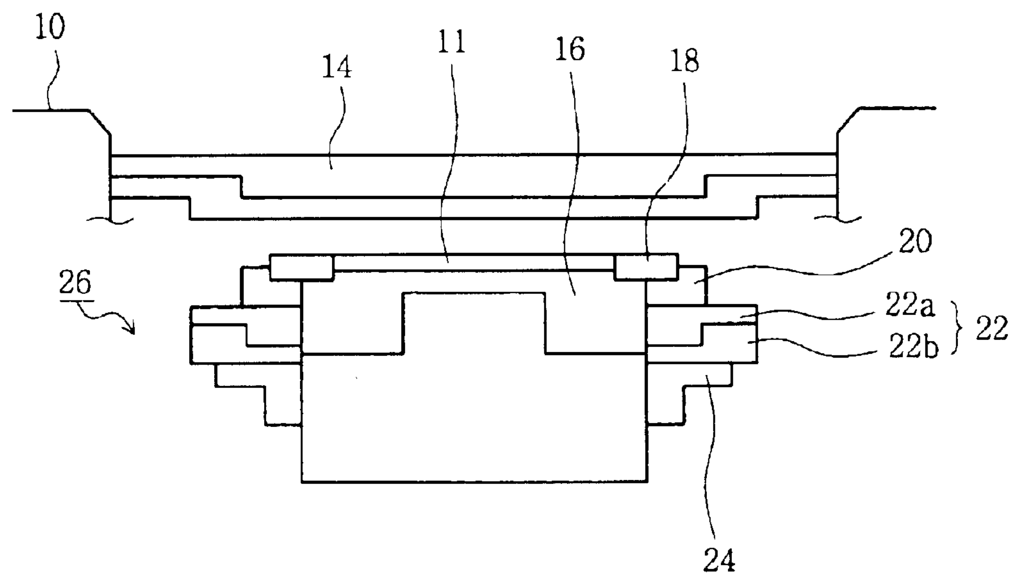
FIG. 3 illustrates a structure diagram of a structure in which an exhaust ring according to an embodiment of the present invention is provided in a process chamber.
Figure 4:
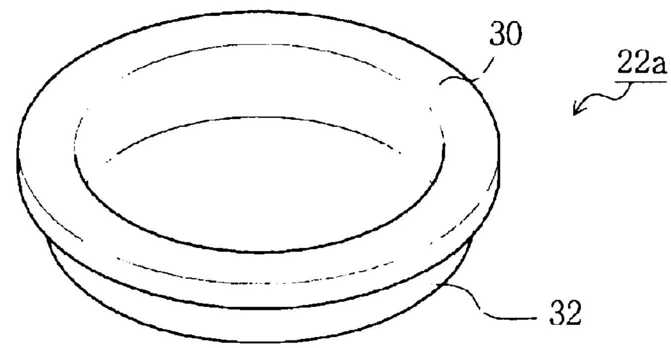
FIG. 4 illustrates a perspective view of an exhaust ring according to an embodiment of the present invention.
Figure 4:
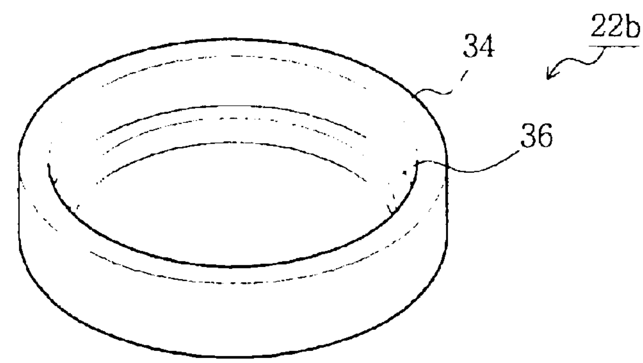
Figure 5:
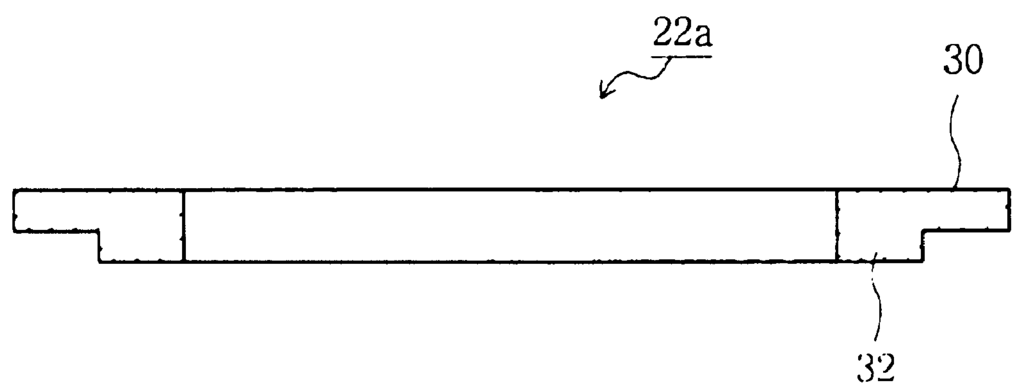
FIG. 5 illustrates a cross-sectional view of an exhaust ring according to an embodiment of the present invention.
Figure 5:
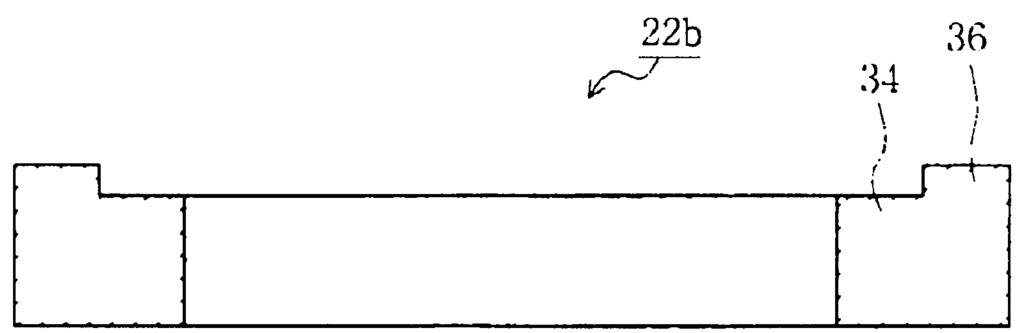

Referring to FIGS. 3, 4, and 5, an electrostatic chuck 26, in which the lower electrode 16 is included, is formed in a circular plate to support a wafer 11. Exhaust ring 22 is provided between a cover ring 20 and a base ring 24. The exhaust ring 22 is formed of an upper ring 22*a*, which is exposed to plasma, and a lower ring 22*b*, which is covered by the upper ring 22*a* and not exposed to plasma. Preferably, the upper ring 22*a* is made of a VESPEL® material, which is a polyimide resin manufactured by DuPont™, and formed of an outer ring 30 of flange shape, which is exposed to plasma, and a projection part 32, beyond which the outer ring 30 extends to a predetermined length.

Preferably, the lower ring 22*b* is made of a ceramic material and formed of an inner ring 34 and an inner flange 36, which are not exposed by plasma. The inner flange 36 is formed by bending the inner ring in an inner direction. The projection part 32 of the upper ring 22*a* is inserted into the lower ring 22*b* to be coupled to the inner flange 36. During the etching process, only the upper ring 22*a* is exposed to plasma and etched. The lower ring 22*b* is covered by the upper ring 22*a* and not exposed to nor damaged by plasma.

When the upper ring 22*a* is etched and damaged by plasma, the upper ring 22*a* will require replacement, but the lower ring 22*b*, which is not exposed to nor damaged by plasma, does not need to be replaced and therefore production costs are reduced.

In addition, since the upper ring 22*a* is made of a VESPEL® material rather than conventional quartz, the upper ring 22*a* is etched less by the plasma and the lifetime of the upper ring is therefore extended. Furthermore, less etching of the upper ring 22*a*, and therefore the exhaust ring 22, serves to substantially reduce the creation of particles on the wafer, thereby increasing the wafer yield.

A preferred embodiment of the present invention has been disclosed herein and, although specific terms are employed, they are used in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. An exhaust ring of a dry etching apparatus comprising an upper ring that is partially exposed to plasma by a cover ring, the cover ring for supporting a focus ring and being disposed above the exhaust ring, and a lower ring that is not exposed to plasma, the lower ring being covered by the upper ring, wherein the upper ring includes a projection part inserted into the lower ring and an outer flange portion, the outer flange portion abutting a top of the lower ring, and wherein the lower ring includes an inner flange portion, the inner flange portion abutting a bottom of the projection part.

2. The exhaust ring as claimed in claim 1, wherein the upper ring is made of a VESPEL® material.

3. The exhaust ring as claimed in claim 1, wherein the lower ring is made of a ceramic material.

4. The exhaust ring as claimed in claim 1, wherein the upper ring is formed of a projection part and an outer ring, wherein the outer ring is exposed to plasma and extends beyond the projection part by a predetermined length.

5. The exhaust ring as claimed in claim 1, wherein the lower ring is formed of an inner ring that is not exposed to plasma and an inner flange that is formed by bending the inner ring in an inner direction.

6. The exhaust ring as claimed in claim 1, wherein the upper ring serves to prevent particles from being created thereon during an etching process.

7. A dry etching chamber of an etching apparatus, comprising:

a housing;

an upper electrode at an upper portion of the housing;

a focus ring positioned under the upper electrode;

a lower electrode facing the upper electrode;

a cover ring provided at an outer wall of the lower electrode to support a portion of the focus ring;

an exhaust ring provided at a lower portion of the cover ring, the exhaust ring including an upper ring that is exposed to plasma and a lower ring that is not exposed to plasma; and a base ring provided at a lower portion of the exhaust ring, wherein the upper ring includes a projection part inserted into the lower ring and an outer flange portion, the outer flange portion abutting a top of the lower ring, and wherein the lower ring includes an inner flange portion, the Inner flange portion abutting a bottom of the projection part.

8. The dry etching chamber as claimed in claim 7, wherein the upper ring is exposed to plasma through the cover ring.

9. The dry etching chamber as claimed in claim 7, wherein the upper ring extends beyond the cover ring.

10. The dry etching chamber as claimed in claim 7, wherein the upper ring completely covers an upper surface of the lower ring.

11. The dry etching chamber as claimed in claim 7, wherein the upper ring includes a projection part inserted into the lower ring and an outer flange portion.

12. The dry etching chamber as claimed in claim 11, wherein the lower ring includes an inner ring, the projection part of the upper ring being inserted in the inner ring.

13. The exhaust ring as claimed in claim 1, wherein the upper ring extends beyond the cover ring.

14. The exhaust ring as claim in claim 1, wherein the upper ring completely covers an upper surface of the lower ring.

15. The exhaust ring as claimed in claim 1, wherein the lower ring includes an inner ring, the projection part of the upper ring being inserted in the inner ring.

16. The exhaust ring as claimed in claim 15, wherein in outer diameter of the outer flange portion equals an outer diameter of the inner ring.

17. The exhaust ring as claimed in claim 15, wherein an inner diameter of the inner ring equals an outer diameter of the projection part.

18. The exhaust ring as claimed in claim 7, wherein the inner flange portion is thicker than the projection part.

* * * * *